US007085694B2

(12) United States Patent
Xavier et al.

(10) Patent No.: US 7,085,694 B2
(45) Date of Patent: Aug. 1, 2006

(54) APPARATUS AND METHOD FOR INTERACTION PHENOMENA WITH WORLD MODULES IN DATA-FLOW-BASED SIMULATION

(75) Inventors: Patrick G. Xavier, Albuquerque, NM (US); Eric J. Gottlieb, Corrales, NM (US); Michael J. McDonald, Albuquerque, NM (US); Fred J. Oppel, III, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 908 days.

(21) Appl. No.: 10/037,096

(22) Filed: Oct. 22, 2001

(65) Prior Publication Data

US 2003/0079207 A1    Apr. 24, 2003

(51) Int. Cl.
*G06G 7/48* (2006.01)
(52) U.S. Cl. .................................. 703/7; 703/6; 703/8
(58) Field of Classification Search ...................... 703/7
See application file for complete search history.

(56) References Cited

U.S. PATENT DOCUMENTS

| 5,247,650 A | 9/1993 | Judd et al. |
| 5,340,056 A | 8/1994 | Guelman et al. |
| 5,863,203 A | 1/1999 | Bragdon |
| 5,910,903 A | 6/1999 | Feinberg et al. |

OTHER PUBLICATIONS

Dixon, Kevin; Dolan, John; Huang, Wesley; Paredis, Christiaan; Khosla, Pradeep; "RAVE: A Real and Virtual Environment for Multiple Mobile Robot Systems", 1999, Proceedings of 1999 IEEE/RSJ International Conference on Intelligent Robots and Systems.*

(Continued)

*Primary Examiner*—Paul L. Rodriguez
*Assistant Examiner*—Russ Guill
(74) *Attorney, Agent, or Firm*—William R. Conley; Suzanne L. K. Rountree; Michael K. Mutter

(57) ABSTRACT

A method and apparatus accommodate interaction phenomenon in a data-flow-based simulation of a system of elements, by establishing meta-modules to simulate system elements and by establishing world modules associated with interaction phenomena. World modules are associated with proxy modules from a group of meta-modules associated with one of the interaction phenomenon. The world modules include a communication world, a sensor world, a mobility world, and a contact world. World modules can be further associated with other world modules if necessary. Interaction phenomenon are simulated in corresponding world modules by accessing member functions in the associated group of proxy modules. Proxy modules can be dynamically allocated at a desired point in the simulation to accommodate the addition of elements in the system of elements such as a system of robots, a system of communication terminals, or a system of vehicles, being simulated.

24 Claims, 7 Drawing Sheets

OTHER PUBLICATIONS

Buschmann, Frank; Meunier, Regine; Rohnert, Hans; Sommerlad, Peter; Stal, Michael; "Pattern-Oriented Software Architecture A System of Patterns", 1996, John Wiley & Sons.*

Oualline, Steve; "Practical C++ Programming", 1995, O'Reilly & Associates.*

Tanenbaum, Andrew S.; "Computer Networks", 1996, third edition, Prentice Hall.*

Otter et al., "Hybrid Modeling in Modelica based on the Synchronous Data Flow Principle," CACSD'99, Aug. 22-26, Hawaii, USA, 1999, pp. 1-7.

Mattsson et al., "An Overview of the Modeling Language Modelica," Eurosim'98 Simulation Congress, Apr. 14-15, 1998, Helsinki, Finland, pp. 1-5.

Elmqvist et al., "An Introduction to the Physical Modeling Language Modelica," Proceedings of the 9th European Simulation Symposium, ESS'97, Oct. 19-23, 1997, Passau, Germany, pp. 1-5.

Dixon et al., "RAVE: A Real and Virtual Environment for Multiple Mobile Robot Systems," Proceedings of the 1999 IEEE/RJS International Conference on Robotics and Systems (IROS '99), pp. 1-8.

Diaz-Calderon et al., "A Composable Simulation Environment for Mechatronic Systems," 1999 SCS European Simulation Symposium, Erlangen, Germany, Oct. 26-28, 1999, pp. 1-7.

Stewart et al., "Design of Dynamically Reconfigurable Real-Time Software Using Port-Based Objects," IEEE Transactions on Software Engineering, vol. 23, No. 12, Dec. 1997, pp. 759-776.

Anderson, R. J., "*Building A Modular Robot Control System Using a Passivity and Scattering Theoryl*", 1996 IEEE International Conference on Robotics and Automation (ICRA), Minneapolis, MN 1996, pp. 698-705.

Hudson, et al, "*V-Collide: Accelerated Collision Detection for VRML*", Proceedings VRML '97, Monterey, CA Feb. 1997.

Kavraki and Latombe, "*Chapter 3: Probabilistic Roadmaps for Robot Path Planning,*" in Practical Motion Planning in Robotics, Gupta, Kamal; DelPobil, Angel P. (ed.s) John Wiley & Sons, Chichester (West Sussex), England 1998, pp. 33-53.

Xavier, Patrick, "*Fast Swept-Volume Distance for Robust Collision Detection*", IEEE International Conference On Robotics and Automation, Albuquerque, NM, Apr. 20-25, 1997.

Schoenwald et al, Decentralized Control of a Collective of Autonomous Robotic Vehicles, 2001 American Control Conference, Arlington, VA Jun. 25-27, 2001.

* cited by examiner

APPARATUS AND METHOD FOR INTERACTION PHENOMENA WITH WORLD MODULES IN DATA-FLOW-BASED SIMULATION

This invention was made with Government support under Contract DE-AC04-94AL85000 awarded by the U.S. Department of Energy. The Government has certain rights in the invention.

BACKGROUND OF THE INVENTION

The present invention is related to data-flow-based computer simulation of systems. In particular, the present invention is related to modules for accommodating interaction phenomena associated with simulation.

Robotic, or more inclusively, intelligent machine (IM) system technologies are growing in capability and the degree and scope with which they can be integrated. Whereas factories once used robots in cells of integration, modern factories have begun to exhibit characteristics of integrated, distributed, multi-user IM systems. Likewise, new military concepts are emphasizing network-centric warfare with distributed sensing, computer-assisted decision-making and automated response over earlier concepts using discrete independently controlled robots. New military systems will also behave like integrated, distributed, multi-user IM systems. The world is moving from systems using robots to systems which, while using robots, are themselves robotic. At the same time, rapidly accelerating computer capabilities make computationally intensive user interfaces with 3D simulation environments proliferate.

An advantage of data-flow-based modular simulation is that a data-flow network can structurally model the complex system being simulated, while individual modules can easily be replaced or modified as needed to change simulation fidelity, incorporate improved simulation models, reflect component modifications, and the like. All the usual advantages of modular software—code-reusability, robustness, maintainability, also apply.

In conventional data-flow-based modular simulation, e.g., LabView, Simulink, and the like, each individual module simulates a component of the larger system. Simulation of this kind can be considered a form of what has become known in the art as port-based simulation. In a data-flow-based modular simulation, each module is an automaton taking data at its input ports, performing some type of computation involving the data, and providing the data, which can be transformed according to a suitable transfer function, at its output ports, usually once per simulation cycle. In a clean implementation, computation or transformation is performed by what is referred to as the module's update function. In accordance with a typical C++ implementation, modules are instances of classes and can retain their state between simulation cycles. Data flows through connections from one module's output port to another module's input port, with each connection carrying information created by the sender to be used by recipients. If the data flow graph representing the data flow among a network of modules contains cycles, then a minimal set of connections can be established such that the original graph minus the set of connections is acyclic. The set of connections can be designated, for example, as feedback connections in the simulation description. It should be noted that the feedback connections are not considered when determining update order. Thus, the order in which modules' update functions are called during a simulation cycle is determined by the data flow graph minus feedback connections, and the data at the output port of a feedback connection is readable at the corresponding input port during the following simulation cycle.

Such a basic approach is useful for simulating a system whose components have static interaction relationships. For example, a network of modules might be used to simulate a robotic manipulator. If, however, two entities to be simulated do interact, a simple approach to simulating the resulting coupled system involves modifying connections of interacting modules. It should be noted that in a conventional data-flow-based and port-based modular simulation system, all data movement between modules occurs through data-flow connections. Accordingly, in order to simulate two interacting entities associated with such a system, either data-flow connections should be established from modules simulating one entity to modules simulating the other, and possibly vice-versa, or a chain of alternating data-flow connections can be established between modules simulating one entity to modules simulating the other, perhaps forming something resembling a switching network.

A problem arises however, in that interaction phenomena can involve a large and/or undetermined number of devices or components. Since, in general, in data-flow-based modular simulation, e.g., LabView, Simulink, and the like, the types and number of input and output ports of a given module class are static, conventional approaches to dealing with interaction phenomena associated with interfacing with large undetermined numbers of devices might include each simulated module to have inputs connected to the outputs of the corresponding modules with a quadratic number of connections. If a switching module is used to connect inputs to outputs, the quadratic number of connections can be replaced with a linear number of connections. Assuming that modules behave properly when not all inputs are connected, such an approach might be sufficient when fewer than the original number of entities are involved. However, if it becomes necessary to simulate a scenario containing more than the original number of entities, the module code would require modification, leading to a multiplicity of module classes which would be identical except for the numbers of input and output ports.

It would be desirable therefore in the art for a method and apparatus for extending data-flow-based simulation with modules for accommodating interaction phenomena. Such a method and apparatus would allow large and/or undefined numbers of connections to be accommodated without modifying simulation module classes.

SUMMARY OF THE INVENTION

Thus, to address the above-described problems, a method and apparatus are provided in accordance with various exemplary embodiments of the present invention, for accommodating interaction phenomenon in a data-flow-based simulation of a system of elements. Accordingly, a plurality of meta-modules are established with each of the plurality of meta-modules simulating an element such as an individual robot, a communication terminal, a vehicle or the like, in a system of elements such as for example, a system of embodied agents, a system of robots, a system of mobile communication terminals, a system of vehicles, or the like.

One or more world modules may then be established associated with respective interaction phenomenon such that each of the world modules is associated with a proxy module from each meta-module in a group of meta modules associated with the respective interaction phenomenon. The world modules may include, for example, one or more of a communication world, a sensor world, a mobility world, and a contact world. Simulation may then proceed of the interaction phenomenon in a corresponding world module (for example, this can entail accessing member functions in the associated group of meta-modules). Both world and proxy modules can be dynamically allocated at a desired point in the simulation so as to accommodate the addition of an element. Dynamic allocation includes adding compiled meta-modules or world modules to a running simulation and does not affect complied code modules already part of the simulation.

It should be noted that in accordance with various alternative exemplary embodiments in accordance with the present invention, one or more world modules may be associated with each other, with one world module acting as "oracle" and the others as "clients" or the like.

BRIEF DESCRIPTION OF THE DRAWINGS

The present invention will become more fully understood from the detailed description given herein below and the accompanying drawings which are given by way of illustration only, and thus are not limitative of the present invention, wherein like reference numerals represent like elements and wherein.

DETAILED DESCRIPTION

In accordance with various exemplary embodiments, the present invention can be used to overcome disadvantages associated with conventional data-flow-based modular simulation framework, as described hereinabove, to enable suitable handling of interaction phenomena in applications such as, for example, radio, telephone, and related acoustic communications, machine vision and related direct and remote sensing, and contact dynamics.

In applications involving large and/or undetermined numbers of devices or components, the method and apparatus in accordance with various exemplary embodiments of the present invention can be applied in a simulation system where compiled modules may be used in the simulation and modifications due to interaction phenomenon may be made, without recompilation, to accommodate, for example, different interaction patterns and different numbers of interacting devices or components. In accordance with alternative exemplary embodiments, additional software extensions enable function-call oriented software interfaces between entity components, which interfaces are traditionally modeled separately, to be preserved.

It should be noted that while the language of continuous-time simulation as opposed to discrete-event simulation is used herein, various exemplary embodiments in accordance with the present invention are applicable to discrete-event simulation and hybrid continuous-time-discrete-event simulation. Further, where conditions on an order of execution are referred to, what is meant is partial-order constraints, since the present invention can be applicable in multiprocessing and parallel computing environments in addition to other exemplary embodiments as will be described in greater detail hereinafter.

Figure 1:
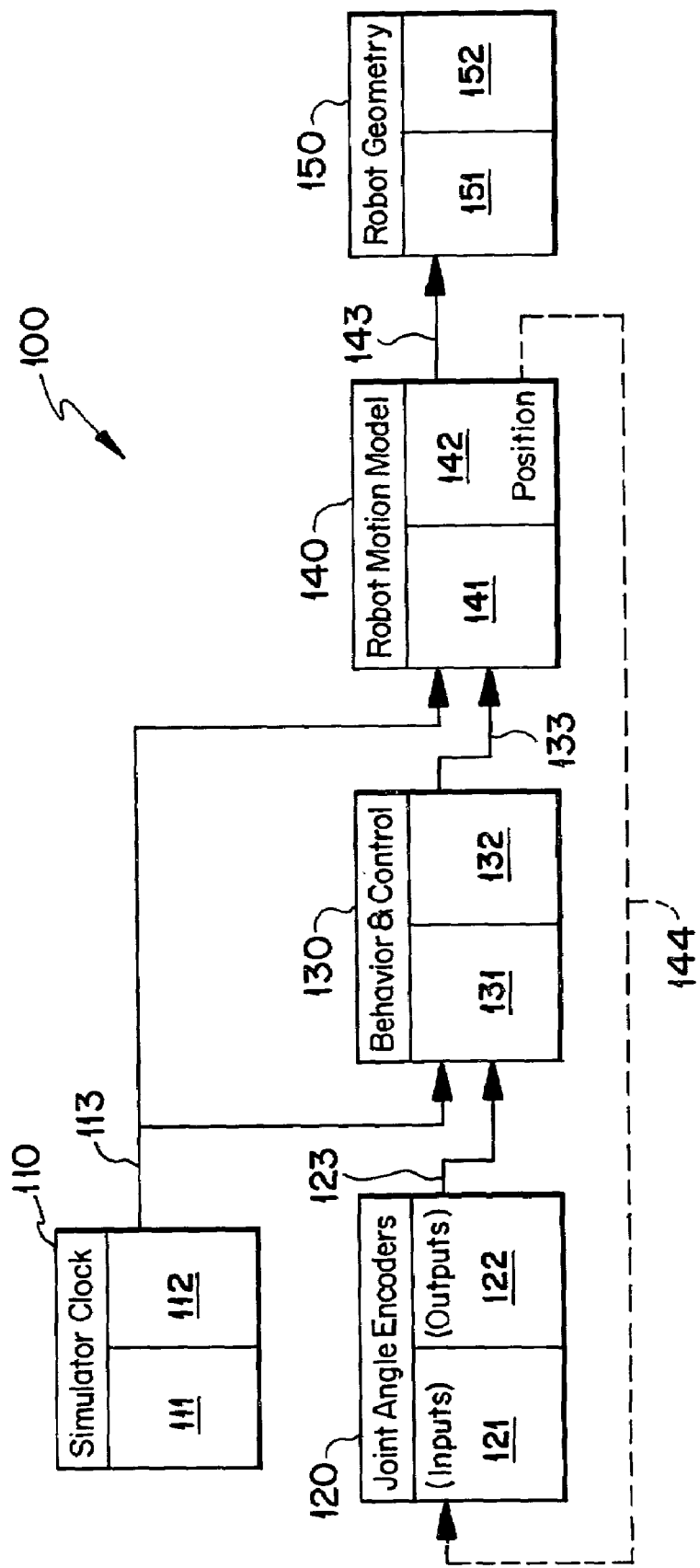
FIG. 1 is a diagram illustrating a conventional data-flow-based modular simulation of an exemplary robot arm.

A basic approach useful for simulating a system whose components have static interaction relationships is illustrated in FIG. 1. In the example shown, a network of modules might be used to simulate, for example, a robot arm. If a sub-network of data-flow simulation modules simulates an entity, e.g., one robot in a system of robots, we say that sub-network is a meta-module that simulates that entity, such as meta-module 100. Accordingly, multiple meta-modules 100 may be used to simulate multiple entities provided they do not interact with each other as in FIG. 1. In meta-module 100, simulator clock 110 has "ports" or data connections including inputs 111 and outputs 112, whose outputs include clock 113. Clock 113 can be connected to modules within meta-module 100 which are central to simulation such as Behav/Ctrl module 130 and robot motion module 140. Other modules such as joint angle encoder module 120 with input and output ports 121 and 122 respectively, and robot geometry module 150 with input and output ports 151 and 152 respectively, reflect the continuous desired and actual position of the robot arm and thus do not rely directly on clock 113 for changing state. Accordingly, robot motion module 140 with input and output ports 141 and 142 respectively, may output a geometric transforms 143 to robot geometry module 150 with position output 144 being fed back to input port 121 of joint angle encoder module 120. Correction output 123, for example, may be input to Behav/Ctrl module 130 with input and output ports 131 and 132 respectively, at input port 131 and the appropriate position output 133 generated at output port 132 which may then be input at input port 141 to robot motion module 140. In the present example, it can be seen that one device, a robot arm, is controlled by meta-module 100.

Figure 2:
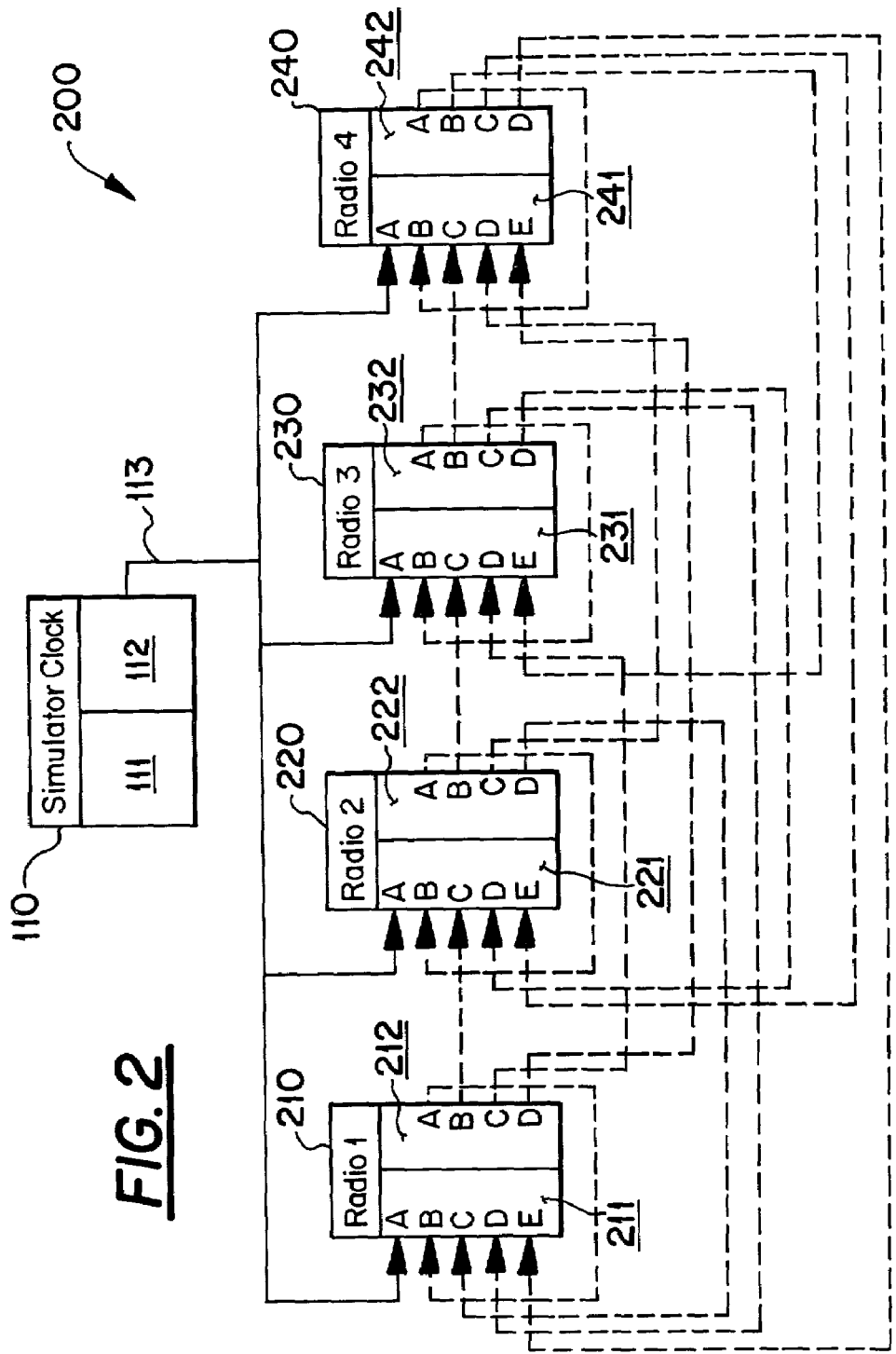
FIG. 2 is a diagram illustrating a data-flow-based modular simulation of an exemplary system of radios.

As previously described, a problem arises in that interaction phenomena can involve a large and/or undetermined number of devices or components. As an example, a system of two-way radios is illustrated in FIG. 2. Since, in general, in data-flow-based modular simulation, e.g., LabView, Simulink, and the like, the types and number of input and output ports of a given module class is static, one approach to dealing with interaction phenomena associated with interfacing with large undetermined numbers of devices, would be for each of "k" simulated radio nodes, e.g. nodes 210, 220, 230, and 240 to have k−1 inputs that would be connected to the outputs of the other k−1 radios. For example, node 210 has inputs 211 C, D, and E which are from outputs 222 D, 232 C, and 242 D respectively. Thus, in such an example, there would In accordance therefore with various exemplary embodiments of the present invention, a data-flow-based simulation model can be augmented with world modules for each type of interaction phenomenon, such as radio communications interaction, sensing interaction, contact physics interaction, and the like. Each different type of entity remains modeled by a meta-module different from other meta-modules in the sense that there is no need for data-flow connections or a chain of data-flow connections from modules in a first type of meta-module to modules in other types of meta-modules in order to model such interaction phenomena. It should be noted however that under certain circumstances meta-modules may share some, usually global, information, e.g. meta-modules may share a common clock.

Figure 4:
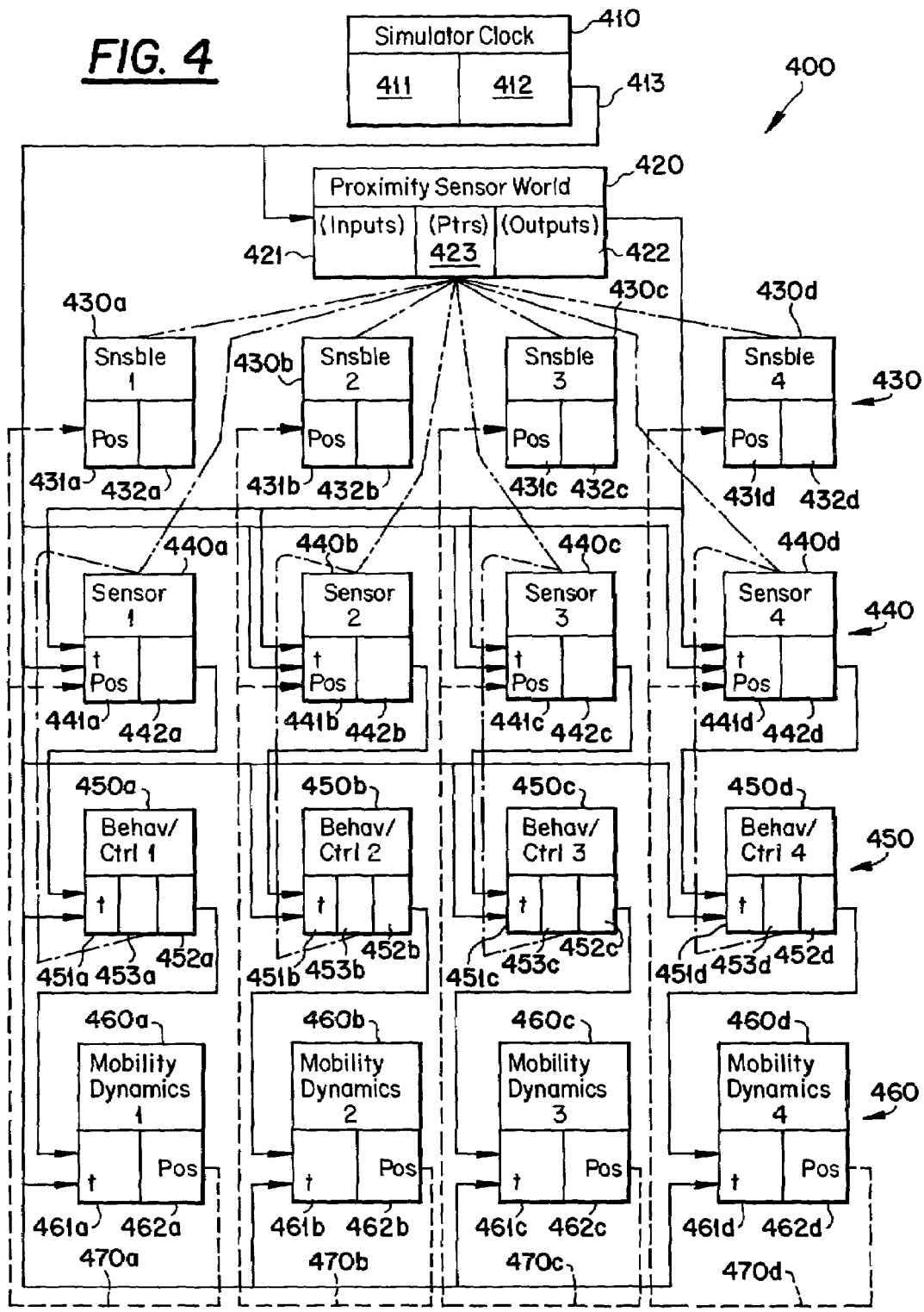
FIG. 4 is a diagram illustrating a data-flow-based modular simulation of an exemplary system including sensors and a sensor world model in accordance with various exemplary embodiments of the present invention.

In accordance with various exemplary embodiments of the present invention, as illustrated in FIG. 4, specific modules such as snsble proxy modules 430*a*–430*d*, sensor proxy modules 440*a*–440*d*, Behav/Ctrl modules 450*a*–450*d*, and mobility and mobility dynamics modules 460*a*–460*d* are each associated with a meta-module (not shown). Some of the modules may further be associated with a given interaction phenomenon and are said to belong to the world module associated with that phenomenon. More specifically, such modules may be referred to as proxies of the corresponding entities. In FIG. 4, world module 420 is associated with proximity sensors. As can be seen, snsble proxy modules 430*a*–430*d* and sensor proxy modules 440*a*–440*d* are connected to world module 420 through pointers 423 and may be said to be proxies of the corresponding entities and "belong" to world module 420. A simulation update function of world module 420 simulates the occurrence of the associated phenomenon, and in doing so, reads and writes data belonging to the proxy modules that are members of be $O(k^2)$ connections. Assuming that modules behave properly when not all inputs are connected, this would be sufficient when fewer than k radios are involved. Unfortunately, if a scenario containing more than k radios must be simulated, radio module source code would have to be modified and recompiled leading to an accumulation of radio-module classes in a simulation library which classes are identical except for the numbers of input and output ports.

Figure 3:
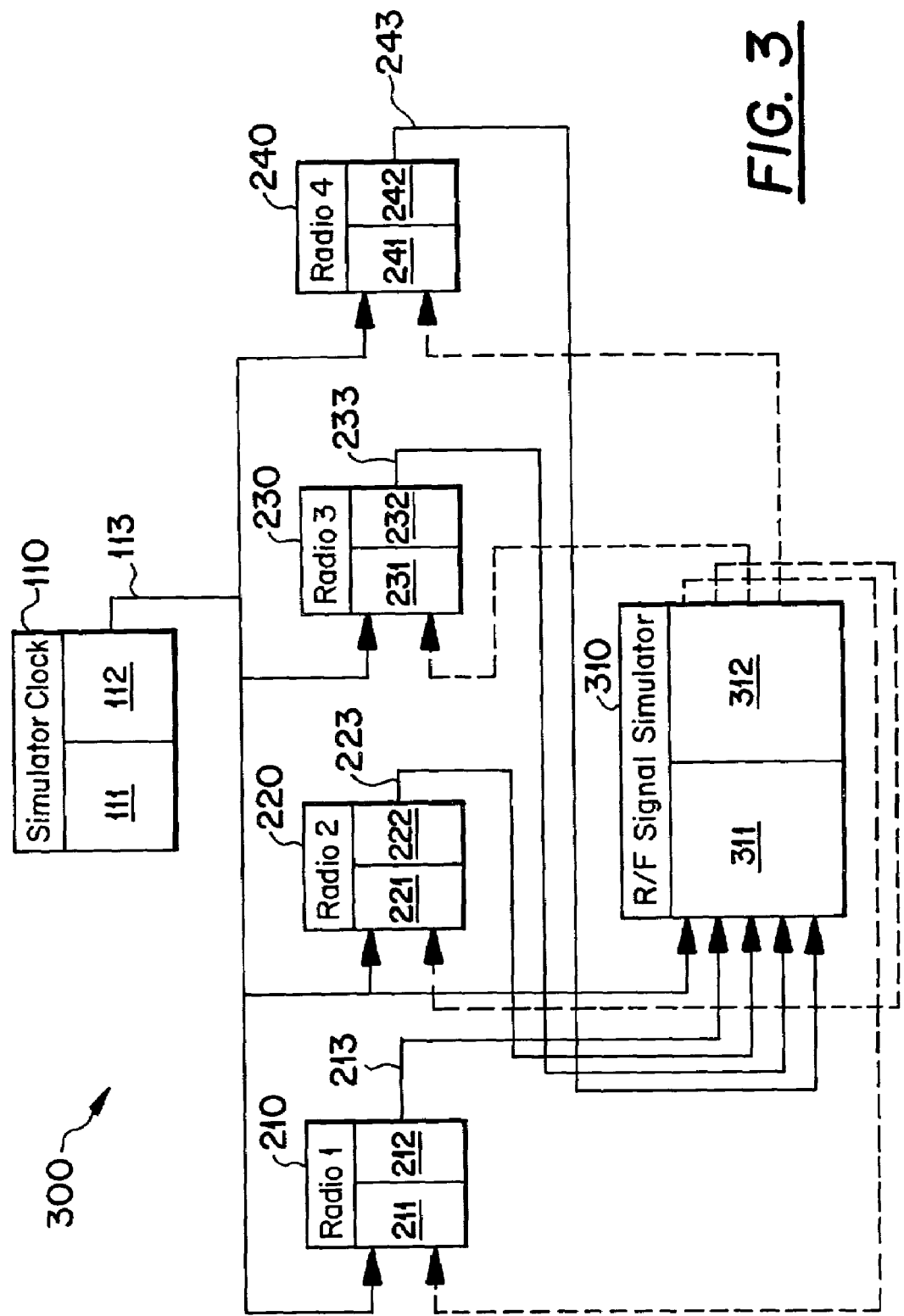
FIG. 3 is a diagram further illustrating a data-flow-based modular simulation of an exemplary system of radios.

A less simplistic approach to the above example as illustrated in FIG. 3, includes introducing switching module 310 with k inputs 311 connected to outputs 213, 223, 233, and 243 of radio nodes 210, 220, 230, and 240 respectively and k outputs 312 connected to inputs 211, 221, 231, and 241 of radio nodes 210, 220, 230, and 240 respectively. By configuring inputs and outputs in this way, the quadratic number of connections is replaced with a linear number of connections. However, source code associated with switching module 310 would still have to be modified if more than k radios were included in the scenario, leading to a multiplicity of switching module classes that are almost identical except for the number of inputs and outputs. A conventional data-flow based simulation framework cannot enable the number of ports on any given module to be changed on-the-fly without module re-compilation or replacement.

An additional problem includes interaction between components through a software interface, e.g. emulating function calls though data flow connections. In a pure data-flow-based simulation such interaction can be clumsy. Input and output ports compatible with all function argument lists in software component interfaces are needed. Return values may be obtained through feedback connections a cycle later. that world. It should be noted that when a proxy module models an entity's component to which other components are connected via a software interface, a pointer of that proxy is provided to those components so they can access the software interface. An example of such pointer provisions can be seen in FIG. 4 where Behav/Ctrl modules 450*a*–450*d* are provided with pointers to sensor proxy modules 440*a*–440*d* to enable the modeled behavior and control component to access the modeled software interface of the sensor. Mobility dynamics modules 460*a*–460*d* can model position information which can be further input to snsble proxy modules 430*a*–430*d* and sensor proxy modules 440*a*–440*d* through feedback connections 470*a*–470*d* which will be described in greater detail hereinafter. Because not all data movement among modules goes through connectors, use of inter-module pointers may stretch the definition of "data-flow-based" simulation, but most of the desired characteristics are preserved. Further, when access to a proxy module is restricted to world module 420 and one other module, it may be possible to avoid requiring non-world modules to possess pointers to other modules.

An exemplary data-flow-based simulation in accordance with various exemplary embodiments of the present invention includes a system referred to hereinafter as "Umbra". Since in Umbra all modules are a part of the data-flow graph representing the simulation of the entire system of elements, world module 420 and associated proxy modules such as snsble proxy modules 430*a*–430*d*, and sensor proxy modules 440*a*–440*d*, along with Behav/Ctrl modules 450*a*–450*d*, and mobility and dynamics modules 460*a*–460*d* are a part of the data-flow graph. In addition, in an exemplary Umbra environment, world module 420 may serve to create members, e.g. proxy modules belonging to it; thus, world module 420 can already know about proxy modules through pointers before the creation of a proxy relationship. Like other Umbra modules, world module 420 and associated proxy modules such as snsble proxy modules 430*a*–430*d*, and sensor proxy modules 440*a*–440*d*, can be created or deleted on-the-fly between simulation cycles to enable the addition or removal of entities to/from an ongoing simulation, or even the substitution of a world module and associated proxy modules that model a particular interaction phenomenon differently.

Within an exemplary Umbra framework, Umbra module code can be compiled C++ code. As will be appreciated by those skilled in the art, a Tcl/Tk-based interface is used at runtime and in the midst of simulations to tell compiled C++ code what modules to construct and how to connect them. The Tcl/Tk-based interface enables the mapping of names to modules or pointers to modules, and is also used to provide modules with pointers to proxy modules when needed.

In accordance therefore with various exemplary embodiments of the present invention, consistency and correctness conditions for calling module update functions can be modified. Within a simulation update cycle, world module 420 preferably does not read data from input ports of a proxy module until the data at those ports is final or valid for the current simulation cycle. Similarly, proxy modules whose inputs ports take the current simulation cycle output of a world member module must not read those input ports until that world module has finished writing its member's output data. It should be noted that the present invention includes the case where update order conditions are relaxed, although simulation correctness can be threatened if update order conditions are relaxed too much.

With reference to FIG. 4, exemplary Umbra network 400 of proxy modules 430*a*–430*d*, 440*a*–440*d*, 450*a*–450*d*, and 460*a*–460*d* simulates, for example, four simplified mobile robots with proximity sensors. Here, the Proximity Sensor world module 420 has access to protected data and member functions of snsble modules 430*a*–430*d* and sensor modules 440*a*–440*d* as described above. It is important to note that Behav/Ctrl modules 450*a*–450*d* have access to the public interfaces of the corresponding Sensor modules. Proximity Sensor world module 420 may also serve to create snsble modules 430*a*–430*d* and sensor modules 440*a*–440*d* as robots/sensors are added to the simulation.

Exemplary Umbra conditions are preferably enforced using further modifications to the conventional data-flow simulation framework as follows. Rather than employing conventional update mechanisms in an exemplary simulation in accordance with the present invention, world module 420 can be configured to cause update functions associated with snsble proxy modules 430a–430d, and sensor proxy modules 440a–440d to be called. Synchronization input ports e.g., "SYNC_IN" and synchronization output ports, e.g., "SYNC_OUT" can be added to proxy modules as necessary. Connections between SYNC_IN port 421 and/or SYNC_OUT port 422 of world module 420 and ports on other world modules (not shown) constrain the order in which update functions may execute, i.e. the order in which worlds are updated. It should be noted that the chains of connections between SYNC_OUT port 422 of world module 420 and sensor proxy modules 440a–440d, and between sensor proxy modules 440a–440d and modules 450a–450d constrain modules 450a–450d to have their update functions executed after world module 420 in the update cycle. The non-feedback connections from, for example, modules 450a–450d to modules 460a–460d, e.g. from output ports 452a–452d to input ports 461a–461d, constrain modules 460a–460d to have their update functions executed after modules 450a–450d in the simulation update cycle. With the exception of input-output synchronization, there are few changes posed by exemplary embodiments of the present invention to the way a data-flow graph is used to determine when module update functions execute during a simulation cycle. It should further be noted that in addition to enforcing update-order constraints using the exemplary methods described hereinabove, dedicated mechanisms can be used in accordance with the present invention to specify update-order constraints to the scheduler. Such mechanisms may include dummy data-flow connections from multiple output ports to single input ports, and the like.

Again referring to FIG. 4, it can be seen that a specific world module, e.g. world module 420, is preferably responsible for robot-robot-proximity-sensing interaction. Each robot meta-module (not shown) will have a proximity-sensor module 440 and a proximity-snsble module 430 belonging to the proximity-sensing world. Proximity sensor module 440's outputs 442 connect to inputs 451 of Behav/Ctrl modules 450 associated with real robot components using real proximity sensors. In contrast, proximity-snsble module 430's inputs include aspects of the robot's state e.g., configuration, velocity, etc. from Mobility Dynamics module 460 affecting its sensor signature. During each step of the simulation, the proximity-sensing world is responsible for reading data from all proximity-sense-able modules and each proximity-sensing module and using that data to determine the new state of each proximity-sensing module.

In exemplary Umbra embodiments multiple worlds are common. Examples of Umbra worlds include a radio communications world, various sensor/sensing worlds, terrain-based mobility dynamics world, and a multi-body contact dynamics world. In addition, Umbra scene-graph used by an Umbra visualizer may typically be integrated into Umbra simulations as part of a world module.

World modules can also serve as "oracles" in that information accessible to a world module may be used by other Umbra world modules and/or their respective worlds. One example includes a world whose member modules are associated with representations of the geometry of simulated objects and answer queries about the spatial relationships of those objects and other sensors e.g., line-of-sight relationships. In such an example, the spatial "world" may act as an oracle to, for example, the sensor world, which may be referred to as a client world, to better inform the sensor world of the operating environment. Use of one Umbra world as an oracle for another Umbra world requires that the client world module knows of the existence of the oracle world module and knows the association between their members and the members of that oracle. The member association can be made through a Tcl script interface and can be implemented by pointers when in a uni-processor environment. Efficient schemes in a message-passing multi-processor environment are more complicated.

As will be appreciated by those skilled in the art, data movement between modules in conventional data-flow-based simulation systems is through connections between modules in the data-flow graph. In conventional systems, if there are n entities that can be directly affected by or can directly cause effects in a given interaction phenomenon, then generally either: a) the meta-module for each such entity must have data flow connections to meta-modules of the other such entities, resulting in $o(n^2)$ data-flow connections in the simulation data-flow network; or b) the interaction phenomenon may be separately simulated by a module, e.g., a "switch" as described above, with o(n) input ports and output ports connected to modules in the n meta-modules simulating the n entities. Other characteristics of conventional methods limit the flexibility of simulations particularly with regard to interaction with a varying number of devices and/or interfaces.

In contrast, a method and apparatus in accordance with various exemplary embodiments of the present invention, provides world modules to simulate interaction phenomena. World modules simulate interaction phenomena in data-flow-based simulation in a manner which is distinguished from conventional data-flow-based simulation systems in that a world module in accordance with the present invention has a special capability or access privilege to read and write certain data of proxy modules associated with it, and has similar access privileges to certain member functions of associated proxy modules. The update function of the world module is responsible for simulating the interaction phenomenon associated with it by exercising these privileges. Proxy modules included in an entity's meta-module contain a representation of the part of that entity's state that is relevant to the phenomena as simulated by the world modules. World modules and proxy modules have ports and are a part of the simulation data-flow graph. If a function-call interface exists between components of an entity and those components are modeled as separate modules, then the module modeling the caller can be given a pointer to the module modeling the callee, enabling the function-call interface to be preserved in the simulation instead of being emulated through data-flow connections. The number of ports that a world module needs is not affected by how many entities might participate in the interaction phenomenon it simulates. If there are n entities that can be directly affected by or directly cause effects in a given interaction phenomenon, each entity's meta-module will preferably include a constant number of proxy modules associated with the phenomenon, and there will be O(n) proxy modules associated with that interaction. Proxy modules can be dynamically allocated in a birthing/generation process by the associated world module at any desired point in a simulation run, so the number of entities that can be added to a simulation and that are candidates to participate in an interaction phenomenon is limited only by memory or storage capacity. In addition, the world module can add ports to and change the configuration of proxy modules which it creates. Thus, in accordance with various exemplary embodiments of the present invention, dynamically allocated proxy modules having update functions, are "owned" by the world modules creating them. Further, the "owner" world module can trigger the update functions associated with the proxy modules as described hereinabove. It is important to distinguish triggering the update modules rather than triggering the update functions using conventional mechanisms.

In accordance with various alternative exemplary embodiments of the present invention, ports of proxy modules could be re-packaged as ports of world modules if the capabilities of world-modules are extended to have a variable number of ports and those ports to have dynamically assigned names. It should be noted that such a re-packaging of ports can be carried out using special functions provided in, for example, a C++ Umbra programming interface, which functions allow for dynamically creating ports (referred to in the Umbra lexicon as "connectors") and adding them to existing modules and for dynamically removing ports from modules. The port can be named when created.

Further, it is not required that a world module be a part of the data-flow graph associated with a simulation, however update order of the non-world modules in the simulation is important. Thus for convenience, world modules are in most circumstances made a part of the data flow graph. To an exemplary Umbra simulation kernel in accordance with the present invention, world modules are treated as other modules.

As previously described, an exemplary Umbra world-module architecture can enable data-flow-based simulation with compiled simulation modules having an invariant number of ports regardless of the number of entities possibly participating in an interaction phenomena. The exemplary Umbra world-module architecture not only allows setting up a simulation with any number of entities without altering code associated with individual modules, but also allows any number of entities to be interactively added to a simulation. Compiled modules representing entities to be added to the simulation can be added while the simulation is running and modules already running in the simulation need not be re-compiled. It should be noted that while the computational steering associated with adding modules to a running simulation can be done through Umbra's Tcl/Tk-based interface, it could also be accomplished through inter-process communication, or like mechanism. In addition, while the world-module examples have described exemplary radio and robot systems, military applications are also possible.

Figure 5:
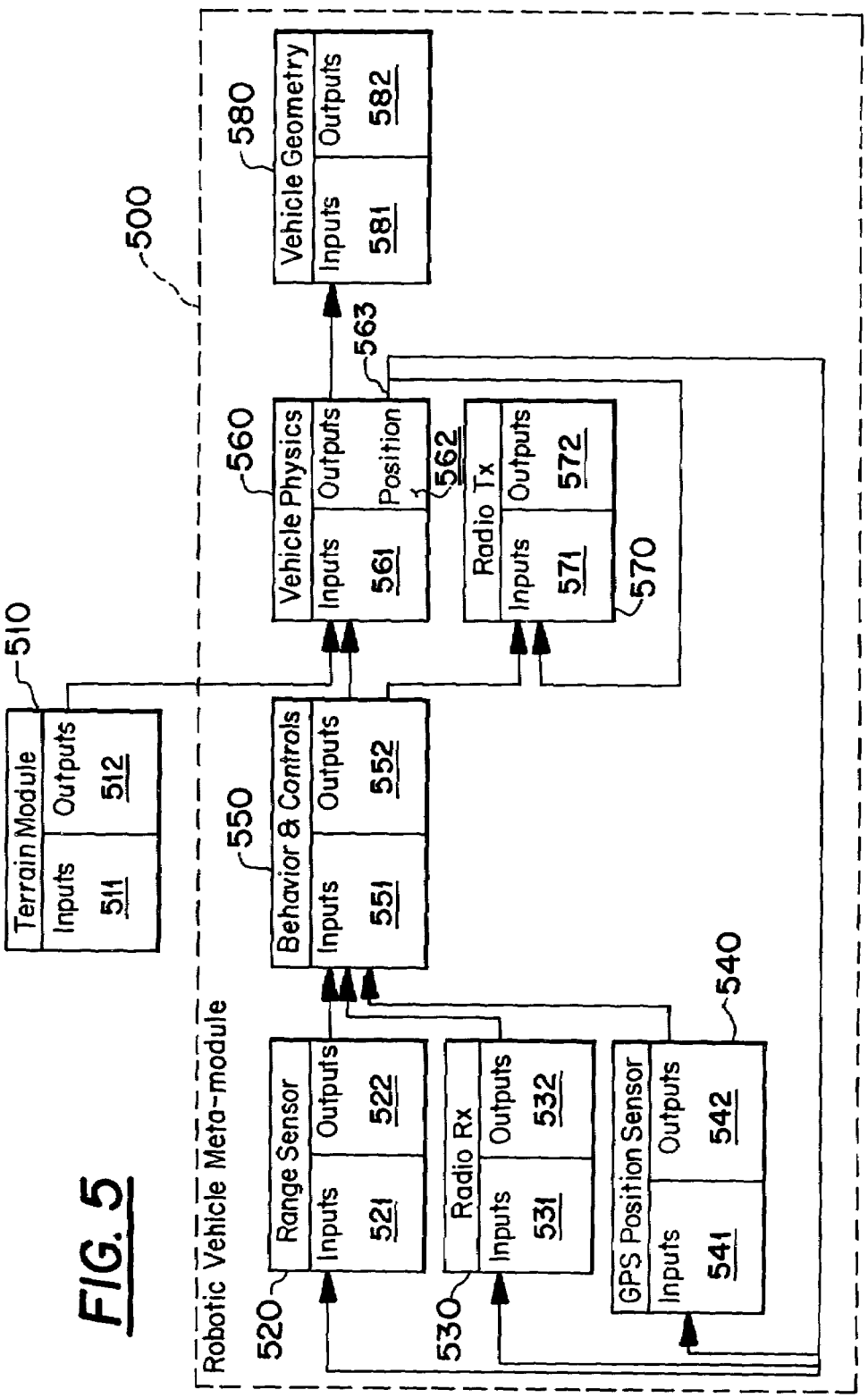
FIG. 5 is a diagram illustrating an exemplary meta-module in accordance with various exemplary embodiments of the present invention.

To provide a better understanding of the present invention from the standpoint of individual entities, FIG. 5 shows a representation of an individual mobile robot modeled as an Umbra embodied agent meta-module 500. Behav/Ctrl module 550 is shown positioned at the center of the model. At each update cycle in a simulation, Behav/Ctrl module 550 executes code related to actions taken by a typical robot within its main control loop. Typically, these actions would include, for example, investigating sensor and communication inputs along with stored state information and then adjusting control outputs and passing messages. It can be seen in FIG. 5 that three input modules are shown, range sensor module 520, radio receiver proxy module 530, and GPS position sensor module 540. It should be noted that while GPS position sensor 540 is shown as a Global Positioning System sensor, different types of position sensors can be used.

Sensor and communications input modules like range sensor module 520, radio receiver proxy module 530, and GPS position sensor module 540 reference terrain and other geometric modules as well as other environment models to compute a simulated sensed value. For example, a Radio Communications world module (not shown) may check a position associated with radio receiver proxy module 530 against positions of radio transmission sources and identify transmission obstacles to determine whether a given signal will reach the receiver. Range sensor module 520 can use geometric analysis techniques to determine whether, for example, an ultrasonic range sensor cone would detect an obstacle. FIG. 5 further shows vehicle physics module 560, radio transmitter proxy module 570, and vehicle geometry module 580. Vehicle physics module 560 can reference, for example, terrain database proxy module 510, owned by Terrain world module (not shown) to compute how the associated vehicle would move under a commanded signal. Radio transmitter proxy module 570 can be used, for example, as a sending point for other vehicle radio receivers. Vehicle geometry module 580 may be used, for example, to drive scene visualization and the like, associated with a simulation.

It should be noted, as should be apparent from the previous description, that multiple copies of identical meta-modules representing identical robot embodied agents can be used to model, for example, homogenous robot swarms. Because meta-modules can be configured through a scripting language, code associated with constructing large swarms is straightforward to implement. Because each meta-module encapsulates its local state data, modules remain distinct and are treated the same way whether used in collections or in isolation.

In accordance with various alternative exemplary embodiments of the present invention, heterogeneous collections of robot agents can be used to model diverse collections of cooperating robot systems. Because meta-modules can be written without reference to the devices to which they attach, robot meta-modules in heterogeneous systems often share many vehicle modules. For example, radio transmitters, vehicle sensors, and sometimes even scalable vehicle physics models are used by meta-modules representing otherwise distinct agents. Similarly, networks of unattended sensors as well as intelligent higher-order sensing devices or "smart" sensors can be modeled with physical modules characterizing sensor performance within a complex environment such as militarily important terrain, behavior or control modules characterizing how the sensors transmit sensed information, and communications or radio models linking to sensor monitoring station models. Monitoring station models likewise include communications and behavior modules to receive and process the sensor data.

Figure 6:
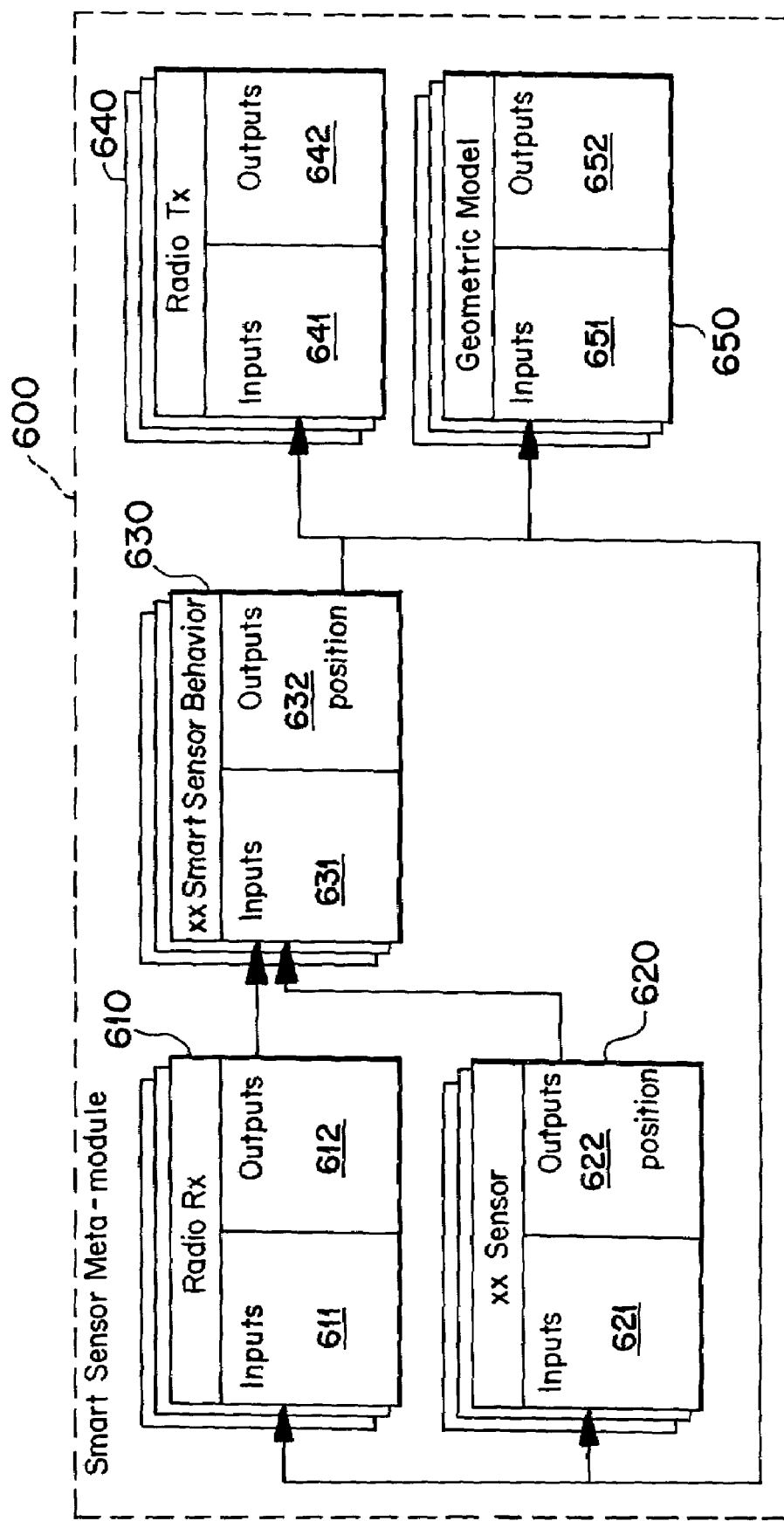
FIG. 6 is a diagram further illustrating an exemplary meta-module in accordance with various exemplary embodiments of the present invention.

Further in accordance with various exemplary embodiments of the present invention, smart sensor meta-module 600, as is shown in FIG. 6, can be used in a more complex simulation. Smart sensor behavior module 630 is similar to Behav/Ctrl module 550 previously described with reference to FIG. 5, smart sensor sensor module 620 is similar to range sensor module 520 previously described, and radio module 640 is similar to radio transmitter proxy module 570 previously described. However, smart sensor Behav/Ctrl module 630 is configured to process or collect raw sensor data and communicate information changes rather than directly control robot motion. Fixed sensors in such a scenario sense different types of environmental effects than would robot-mounted sensors. For example, a smart seismic sensor might need to be modeled by referencing an associated world model to determine the position, size, and speed of all surrounding vehicles and to compute a simulated seismic value for the sensor. A high fidelity module could also consider terrain effects in propagating the seismic events.

It should be noted that the introduction of fixed sensors to mobile robot simulations in accordance with various alternative exemplary embodiments may be advantageous. For example, while fixed sensors might communicate with mobile platforms, more computationally efficient modules might be built for fixed sensors to minimize the number of times that radio disturbance effects need to be computed. The modular framework associated with various exemplary embodiments of the present invention allows more efficient modules to readily interoperate with the more complex mobile sensor models.

Still further in accordance with various exemplary embodiments of the present invention, parallel simulations can be performed by evaluating the computational load of each module and distributing modules across computational resources via statically-scheduled, coarse-grained load balancing. In order to support large-scale, high-fidelity simulations, the present invention uses a MPI protocol to enable efficient distribution of the computing load across multiple processors. Alternatively, dynamic load balancing can be employed but with greater difficulty in that implementation of object migration, e.g. for modules and connection ends, would be required. It should be noted, however, that use of parallel computing environments to perform simulation in accordance with the present invention requires careful matching of compute module timing and code granulation.

Integration of simulation methods of the present invention with other simulation and related tools can be achieved by encapsulating other tool libraries as collections of modules or by providing communications or database linkages to other codes with the latter approach often being referred to as federating. As previously noted, integrated Umbra libraries can result from integrating exemplary Umbra libraries with pre-existing libraries (for example, libraries from the Sandia Modular Architecture for Robotics and Teleoperation (SMART) system as described in *Building a Modular Robot Control System using Passivity and Scattering Theory,* Anderson, R. J. 1996 IEEE International Conference on Robotics and Automation (ICRA), Minneapolis, Minn. 1996, pp 698–705). The SMART technology uses a patented process to guarantee stability of modular software control system. While SMART is useful for robot control, its modules are also useful in a variety of systems where guaranteed control is not required. With approximately 200 modules currently available, the SMART library provides a significant base from which to build. For example, SMART kinematics computational modules can be used to simulate robot manipulators, and SMART user input device modules can be used in training simulator interfaces. To provide exemplary Umbra embodiments with the large database of user interface and robotics control and mathematics modules, special Umbra modules can be built to directly use SMART modules.

Exemplary Umbra embodiments can be integrated with collision detection libraries as described in University of North Carolina (UNC) at Chapel Hill's V-Collide system as further described in *V-COLLIDE: Accelerated Collision Detection for VRML,* Hudson, T. C.; M. C. Lin, J. Cohen, S. Gottschalk, and D. Manocha, Proceedings VRML '97, Monterey, Calif., February 1997, and also as in Sandia National Laboratories' C-Space Toolkit as described in *Fast Swept-Volume Distance for Robust Collision Detection,* Xavier, Patrick, IEEE International Conference On Robotics and Automation, Albuquerque, N.Mex., Apr. 20–25, 1997. Unlike the SMART integration, the V-Collide and C-Space tools can be integrated at the "world" level. For example, in accordance with integrated embodiments of the present invention, geometric computation worlds use a database of scene and other geometry to compute intersections between geometric objects. Accordingly, V-Collide may be used for its high speed analysis in static environments. For example, non-contact sensor simulation modules compute whether cones that represent the sensed region intersect with the surrounding environment. The C-Space Toolkit uses high speed analysis of swept volume intersections. An example would include rapid motion planning for articulated robot manipulators.

In one aspect of federation activities in accordance with various exemplary embodiments of the present invention, specific protocol-dependent world modules are typically developed to support federating exemplary Umbra embodiments with other simulators. Existing communications modules using networking protocols including CORBA, MPI, or TCP/IP, for example, can be leveraged where possible to simplify integration. These same protocols and multiple world model architectures are exploited to provide coarse-grained parallel computation to support large high fidelity simulations as well as to integrate exemplary embodiments of the present invention with operational robot equipment. Federation may further be accomplished in accordance with alternative exemplary embodiments of the present invention using specialized libraries such as, for example, ones that conform to the High Level Architecture (HLA), which is a U.S. DoD and IEEE standard (IEEE-1516) for simulations. An exemplary implementation of such a library is the Umbra HLA Interface Library developed at Sandia National Laboratories, which applies the multiple worlds modules that are a part of this invention and utilizes the Defense Modeling and Simulation Office's Run Time Architecture (RTI) library version 1.3.

It should be noted that environment models typically provide geometric and related datasets that other modules utilize for sensing and physical effects simulation. For example, geometry models can be used in conjunction with V-Collide and CSTK to perform polygon-to-polygon intersection tests to determine whether two geometry sets collide. Various Line of Sight modules can be used this way to determine whether two points in space are obscured by any geometry. Static and dynamic plume modules have been developed to represent chemical and other sensed plumes spread over terrains. Further, a variety of utilities have been developed to import USGS, SAR, and DEM terrain datasets and to create fictitious terrain models. Elevation and image texture mapping may be supported.

Sensor modules typically investigate the environment dataset to simulate sensor values upon which a robot's sensor noise modules can be inserted to study noise effects. Obstacle detection sensors have been modeled where triangles or sets of cones representing laser stripes and infrared proximity detectors are tested for collision to simulate the response of photo detector-based sensors. The V-Collide or C-Space Toolkit libraries can be used for collision computation.

A distance measurement transmitter-receiver module pair has been developed to model ultrasonic measurement system. Ultrasonic transmitters emit an ultrasonic pulse that is heard by receivers on other vehicles. A radio transmission is made at the same time the pulse is sent, allowing each vehicle to measure ultrasonic time of flight and thereby distance from the sending unit. Ultrasonic receiver modules provide chirp results as time of flight and power level and are modeled by testing line of site collisions via, for example, the V-Collide library. Power is blocked by obstacles but otherwise decreases with a $1/r^2$ law.

GPS and compass sensor modules have been developed to provide a device position in space discretized to simulate GPS and digital compasses at various levels of resolution.

Plume sensor modules have been developed to measure local values of plumes (see environment model). Response delays are modeled to reflect the long delays in many chemical sensors.

As will be appreciated, communications models are important for modeling distributed multi-robot systems using radios or other communications networks to communicate. For radio communications, line of site and distance are measured between geometric nodes. The module returns a power function that drops as $1/r^2$ for line of sight and $1/r^4$ if an obstacle has been detected. Multiple transmitter and receiver modules can use same network frequency. Packet collisions are tested as a function of simulated baud rate and overlapping transmissions are scrambled. Multiple data types are supported.

Vehicle Mobility modules typically move a vehicle across a terrain at an ideal bearing and speed determined by its control inputs. For wheeled vehicles, the bearing and speed are typically reduced from the ideal by referencing terrain mobility characteristic modeled through the environment and height, pitch, and yaw are clamped to the terrain. Skid-steered vehicle motion (crawlers/tanks) is computed as a function of commanded right/left side wheel velocities. Motion of a Robotic All Terrain Lunar Exploration Rover (RATLER™, hereinafter "RATLER") vehicle, like those all-terrain robotic vehicles developed by Sandia National Laboratories, is computed like skid-steered vehicle height, pitch, and yaw clamped to terrain using central pivot in body to simulate movement. Ackerman vehicle motion (cars/trucks) is computed as a function of commanded right/left side wheel velocities. A hopper motion is computed by projecting a ballistic travel trajectory based on jump angle and power. Hopper to ground impact is simulated with bouncing, angle of impact and energy dissipation. A mobility-like environment characteristic is used to locally modify energy dissipation rates. Winged/hovering UAV motion may be computed by considering commanded speed and turning angle constraints. The current UAV model provides low fidelity simulation support.

Because many behaviors associated with agents represented by meta-modules are designed hierarchically, they can be readily combined to address new problems. By way of example, different types of behaviors and planning modules include: WayPoint Following—an individual vehicle is commanded to move along a designated route with support for localized obstacle detection/avoidance behaviors in air and ground vehicles; RF-Coordinated Designated Formation Control—a team of vehicles is commanded to move in a designated formation e.g., line, box, phalanx, and the like, with support provided for localized obstacle detection/avoidance behavior; RF Swarm Formation—a team of vehicles is commanded to move in algorithmic formation e.g., cluster at given density using potential field theory, and the like, with support provided for localized obstacle detection/avoidance behaviors; Chemical Plume Swarm—measures chemical or sensed signal intensity to locate plume or signal source; Autonomous Communications Network Deployment:—vehicles move along route and volunteer to become transponders whenever they lose communications with base; Indoor Wall-Following Behavior:—vehicles search out and follow walls to use as navigation within building with local obstacle detection; Vehicle Route Planning:—vehicle route is determined using constraint-based task planning to move vehicle from start point to goal point or high-level goal area, i.e. observe or position vehicle for direct fires, and the like with constraints including terrain slope, visibility from observation point, distance, terrain side slope, communication and maintaining communication are considered during route planning; and Robot Arm collision free motion planning:—collision free motions for robot arms are rapidly computed using Monte Carlo technique similar to algorithms described in *Practical Motion Planning in Robotics*, Gupta, Kamal; DelPobil, Angel P. (ed.s) John Wiley & Sons, Chichester (West Sussex), England 1998, specifically Chapter 3: Probabilistic Roadmaps for Robot Path Planning, by Lydia E. Kavraki and Jean-Claude Latombe, pp. 33–53.

It should be noted that simulations with low fidelity embodied agent systems with over $10^4$ disembodied agent models and high fidelity embodied agent systems with 300 disembodied agent modules at 15 Hz on 1 GHz Pentium III class machines have been successfully achieved in accordance with the present invention however better results are expected on faster platforms which are likely in the future. Exemplary test cases include a swarm of robots programmed to collectively establish a communications network and search a building as further described in *Decentralized Control of a Collective of Autonomous Robotic Vehicles*, Schoenwald, D. A.; Feddema, J. T.; Oppel, F. J., 2001 American Control Conference, Arlington, Va., Jun. 25–27, 2001.

Agents in the disembodied simulation had the following features. The agents were connected into a module network. Each node accepted input values, performed a minimal amount of computation on the input and passed the modified value to its output nodes. Developers monitored agent behavior by placing them on a 2D plane that approximated the network and representing state with color. The number of nodes was increased in successive runs. On a 1 GHz Pentium III computer, approximately $10^4$ nodes were simulated at 15 Hz. These tests demonstrated that exemplary Umbra embodiments in accordance with the present invention, introduce very low overhead for agent scheduling and communication.

Figure 7:
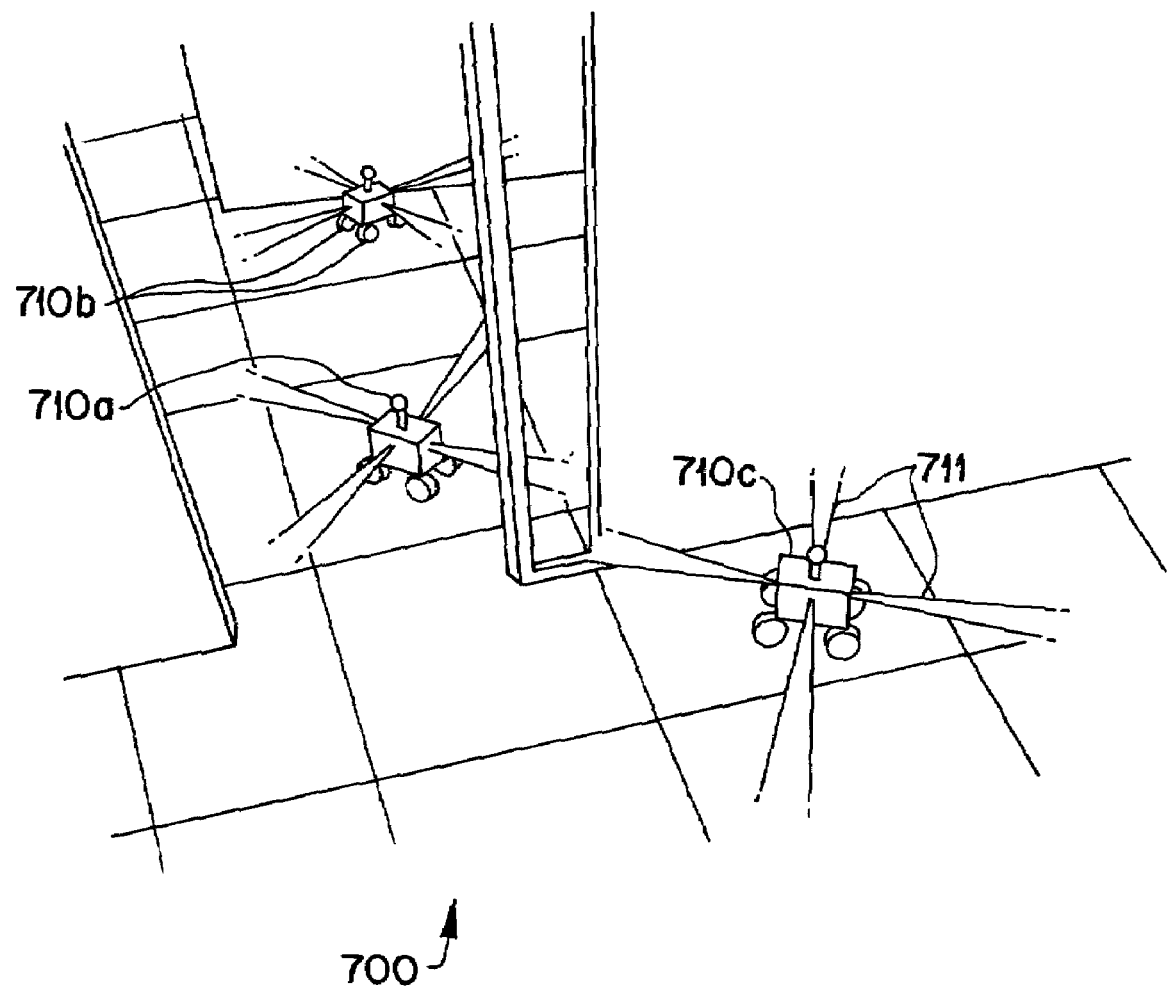
FIG. 7 is a graphical diagram illustrating an exemplary simulation of multiple robotic vehicles in accordance with various exemplary embodiments of the present invention.

Thus, an exemplary team or swarm of small mobile robots operating within a building may be simulated in accordance with the present invention as illustrated in FIG. 7. Each robot 710a–710c has four proximity sensors 711 as illustrated with regard to robot 710c, ultrasonic sender and receiver pairs, and radio transmitter and receiver pairs. Robots 710 use skid steering, and the terrain is flat. Each proximity sensor 711 is modeled with three sets of cones representing long, mid, and close range sensing. Ultrasonic and radio transmission models described above are placed on each vehicle. The building environment 700 is modeled with approximately 1300 triangles. Each vehicle is modeled with approximately 400 triangles.

It is important to note that collision detection consumes the largest amount of computation. At each update, each of the 12 proximity sensor cones associated with robots 710a–710c and the vehicle body are tested for collision. In addition, one vehicle transmits an ultrasonic chirp and radio message on each simulation update. Here, a polygon is created and tested for collision between the transmitting and each potential receiving agent. Thus, each update requires computing 14 collision detection calls for each vehicle. Using a 1 GHz Intel P-III-based computer, the simulation runs at approximately 25 Hz with 15 vehicles (210 collision calls), 15–20 Hz with 20 vehicles (280 collision calls), and 10–15 Hz with 25 vehicles (350 collision calls). Update variation is a result of variable collision detection costs against specific geometric conditions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method practiced on a computer for accommodating interaction phenomena in a data-flow-based simulation of a system of elements, the method comprising:
    establishing a plurality of meta-modules, each of the plurality of meta-modules simulating an element in the system of elements;
    establishing a plurality of world modules associated with respective ones of one or more interaction phenomena such that each of the plurality of world modules is associated with a proxy module from each meta-module of a group of the plurality of meta-modules, the group being associated with one of the one or more interaction phenomena, the proxy module from each meta-module of the group forming a grouping of proxy modules; and,
    providing output of the simulation to one or more users to perform one or more actions selected from, displaying the output, monitoring behavior of one or more elements, controlling one or more elements and, planning a route for one or more elements.

2. The method according to claim 1, wherein the plurality of world modules includes one or more of a communication world, and a sensor world.

3. The method according to claim 1, wherein one or more of the plurality of world modules is associated with another one or more of the plurality of world modules.

4. The method according to claim 1, further comprising the step of simulating one of the one or more interaction phenomena in a corresponding one of the plurality of world modules by accessing one or more member functions in the grouping of proxy modules.

5. The method according to claim 1, further comprising the step of dynamically allocating the proxy module at a desired point in the simulation of the system of elements so as to accommodate addition of an element in the system of elements being simulated.

6. The method of claim 5, further comprising the step of dynamically generating the proxy module by at least one of the plurality of world modules.

7. The method of claim 5, wherein the step of dynamically allocating is performed during execution without re-compiling.

8. The method according to claim 1, further comprising the step of dynamically de-allocating the proxy module at a desired point in the simulation of the system of elements so as to accommodate deletion of an element in the system of elements being simulated.

9. The method of claim 8, wherein the step of dynamically de-allocating is performed during execution without re-compiling.

10. The method of claim 1, wherein the system of elements includes one or more of: a system of embodied agents, a system of robots, a system of mobile communication terminals, and a system of vehicles.

11. The method of claim 1, further comprising the step of at least one of the plurality of world modules dynamically allocating one or more ports to the proxy module.

12. The method of claim 1, further comprising the step of updating the proxy module by at least one of the plurality of world modules.

13. A computer-based apparatus for accommodating interaction phenomena in a data-flow-based simulation of a system of elements, the apparatus comprising:
    a memory for storing a set of instructions;
    a processor coupled to the memory for executing the set of instructions, the set of instructions comprising,
        a first group of instructions for causing the processor to establish a plurality of meta-modules, each of the plurality of meta-modules simulating an element in the system of elements and,
        a second group of instructions for causing the processor to establish a plurality of world modules associated with respective ones of one or more interaction phenomena such that each of the plurality of world modules is associated with a proxy module from each meta-module of a group of the plurality of meta-modules, the group being associated with one of the one or more interaction phenomena, the proxy module from each meta-module of the group forming a grouping of proxy modules.

14. The apparatus according to claim 13, wherein the plurality of world modules includes one or more of a communication world, and a sensor world.

15. The apparatus according to claim 13, wherein one or more of the plurality of world modules is associated with another one or more of the plurality of world modules.

16. The apparatus according to claim 13, wherein the set of instructions further comprises a third group of instructions, the third group of instructions causing the processor to simulate one of the one or more interaction phenomena in a corresponding one of the plurality of world modules by accessing one or more member functions in the grouping of proxy modules.

17. The apparatus according to claim 13, wherein the set of instructions further comprises a fourth group of instructions, the fourth group of instructions causing the processor to dynamically allocate the proxy module at a desired point in the simulation of the system of elements so as to accommodate addition of an element in the system of elements being simulated.

18. The apparatus according to claim 17, wherein the fourth group of instructions further cause the processor to perform dynamic generation of the proxy module using at least one of the plurality of world modules.

19. The apparatus according to claim 17, wherein, in dynamically allocating, the fourth group of instructions further cause the processor to perform dynamic allocation during execution without re-compiling.

20. The apparatus according to claim 13, wherein the set of instructions further comprises a fifth group of instructions, the fifth group of instructions causing the processor to dynamically de-allocate the proxy module at a desired point in the simulation of the system of elements so as to accommodate deletion of an element in the system of elements being simulated.

21. The apparatus according to claim 13, wherein the system of elements includes one or more of: a system of embodied agents, a system of robots, a system of mobile communication terminals, and a system of vehicles.

22. The apparatus according to claim 13, wherein the set of instructions further comprises a sixth group of instructions, the sixth group of instructions causing the processor to dynamically allocate one or more ports to the proxy module from at least one of the plurality of world modules.

23. The apparatus according to claim 13, wherein the set of instructions further comprises a seventh group of instructions, the seventh group of instructions causing the processor to update the proxy module by at least one of the plurality of world modules.

24. A method practiced on a computer for accommodating a plurality of interaction phenomena in a data-flow-based simulation of a system of elements, the data-flow-based simulation involving a plurality of modules, the method comprising:

- simulating each element in the system of elements with a meta-module;
- establishing a world module for each of the plurality of interaction phenomena;
- associating each element in the system of elements with one or more modules in the plurality of modules;
- establishing an association between the world module and a proxy module associated with each of one or more elements of the system of elements which have an association with an interaction phenomena corresponding to the world module; and
- dynamically allocating the proxy module during the simulation so as to accommodate the addition of another element in the system of elements; and,
- providing output of the simulation to one or more users to perform one or more actions selected from, displaying the output, monitoring behavior of one or more elements, controlling one or more elements and, planning a route for one or more elements.

* * * * *